US007018906B2

(12) United States Patent
Chen et al.

(10) Patent No.: US 7,018,906 B2
(45) **Date of Patent: *Mar. 28, 2006**

(54) CHEMICAL MECHANICAL POLISHING FOR FORMING A SHALLOW TRENCH ISOLATION STRUCTURE

(75) Inventors: Coming Chen, Taoyuan Hsien (TW); Juan-Yuan Wu, Hsinchu (TW); Water Lur, Taipei (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/984,045

(22) Filed: Nov. 9, 2004

(65) Prior Publication Data

US 2006/0009005 A1 Jan. 12, 2006

Related U.S. Application Data

(60) Continuation of application No. 10/304,523, filed on Nov. 26, 2002, now Pat. No. 6,838,357, which is a continuation of application No. 09/991,395, filed on Nov. 20, 2001, now Pat. No. 6,486,040, which is a continuation of application No. 09/692,251, filed on Oct. 19, 2000, now Pat. No. 6,448,159, which is a division of application No. 09/111,007, filed on Jul. 7, 1998, now Pat. No. 6,169,012.

(30) Foreign Application Priority Data

Jun. 3, 1998 (TW) .............................. 87108699 A

(51) Int. Cl.
*H01L 21/76* (2006.01)
*H01L 21/20* (2006.01)

(52) U.S. Cl. ...................... 438/427; 438/424; 438/500; 438/778; 438/791; 438/942

(58) Field of Classification Search ................ 438/424, 438/427, 500, 501, 502, 778, 791, 942
See application file for complete search history.

(56) References Cited

U.S. PATENT DOCUMENTS 4,755,050 A 7/1988 Watkins (Continued)

FOREIGN PATENT DOCUMENTS

EP 0 712 156 A2 5/1996

(Continued)

OTHER PUBLICATIONS

Liu, George Y., Zhang, Ray F., Hsu, Kelvin, Camilletti, Lawrence, Chip-Level CMP Modeling and Smart Dummy for HDP and Conformal CVD Films, CMP Technology. Inc., and Rockwell Semiconductor, pp. 8, No Date.

*Primary Examiner*—Kevin M. Picardat
(74) *Attorney, Agent, or Firm*—William J. Kubida; Peter J. Meza; Hogan & Hartson LLP

(57) ABSTRACT

A method of chemical-mechanical polishing for forming a shallow trench isolation is disclosed. A substrate having a number of active regions, including a number of relatively large active regions and a number of relatively small active regions, is provided. The method comprises the following steps. A silicon nitride layer on the substrate is first formed. A number of shallow trenches are formed between the active regions. An oxide layer is formed over the substrate, so that the shallow trenches are filled with the oxide layer. A partial reverse active mask is formed on the oxide layer. The partial reverse active mask has an opening at a central part of each relatively large active region. The opening exposes a portion of the oxide layer. The opening has at least a dummy pattern. The oxide layer on the central part of each large active region is removed to expose the silicon nitride layer. The partial reverse active mask is removed. The oxide layer is planarized to expose the silicon nitride layer.

10 Claims, 4 Drawing Sheets

U.S. PATENT DOCUMENTS 5,459,096 A 10/1995 Venkatesan et al.
5,498,565 A 3/1996 Gocho et al.
5,626,913 A 5/1997 Tomoeda et al.
5,792,707 A 8/1998 Chung
5,837,612 A 11/1998 Ajuria et al.
5,854,133 A 12/1998 Hachiya et al.
5,858,842 A 1/1999 Park
5,885,856 A 3/1999 Gilbert et al.
5,885,886 A 3/1999 Lee
5,893,744 A 4/1999 Wang
5,902,752 A 5/1999 Sun et al.
5,911,110 A 6/1999 Yu
5,923,993 A 7/1999 Sahota
5,926,723 A 7/1999 Wang
5,948,573 A 9/1999 Takahashi
5,958,795 A 9/1999 Chen et al.
5,965,941 A 10/1999 Weling et al.
5,998,279 A 12/1999 Liaw
6,004,863 A 12/1999 Jang
6,013,558 A 1/2000 Harvey et al.
6,020,616 A 2/2000 Bothra et al.
6,043,133 A 3/2000 Jang
6,087,733 A 7/2000 Maxim et al.
6,117,622 A 9/2000 Eisele et al.
6,169,012 B1 * 1/2001 Chen et al. ................ 438/427
6,184,104 B1 2/2001 Tan et al.
6,194,287 B1 2/2001 Jang
6,215,197 B1 4/2001 Iwamatsu
6,259,115 B1 7/2001 You et al.
6,326,309 B1 12/2001 Hatanaka et al.
6,448,159 B1 * 9/2002 Chen et al. ................ 438/500
6,603,612 B1 8/2003 Nakano

FOREIGN PATENT DOCUMENTS

EP 0 712 156 A3 11/1997
JP 06283995 6/1987
JP 62142334 A 6/1987

* cited by examiner

CHEMICAL MECHANICAL POLISHING FOR FORMING A SHALLOW TRENCH ISOLATION STRUCTURE

CROSS-REFERENCE TO RELATED APPLICATION

The present application is a continuation of U.S. patent application Ser. No. 10/304,523, filed Nov. 26, 2002, now U.S. Pat. No. 6,838,357, which is a continuation of U.S. patent application Ser. No. 09/991,395, filed Nov. 20, 2001, U.S. Pat. No. 6,486,040, which is a continuation of U.S. patent application Ser. No. 09/692,251, filed Oct. 19, 2000, now U.S. Pat. No. 6,448,159, which is a divisional of U.S. patent application Ser. No. 09/111,007, filed Jul. 7, 1998, now U.S. Pat. No. 6,169,012 B1, which claims priority from Taiwan Application No. 87108699, filed Jun. 3, 1998, all the disclosures of which are herein specifically incorporated by this reference.

BACKGROUND OF THE INVENTION

1. Field of the Invention

This invention relates to a chemical mechanical polishing (CMP) applied in forming shallow trench isolation (STI), and more particularly, to a process of forming a STI structure combining CMP, using a partial reverse active mask.

2. Description of Related Art

CMP is now a technique ideal for applying in global planarization in very large scale integration (VLSI) and even in ultra large scale integration (ULSI). Moreover, CMP is likely to be the only reliable technique as the feature size of the integrated circuit (IC) is highly reduced. Therefore, it is of great interest to develop and improve the CMP technique in order to cut down the cost.

As the IC devices are continuously sized down to a linewidth of 0.25 μm or even 0.18 μm (deep sub-half micron), using CMP to planarize the wafer surface, especially to planarize the oxide layer on the surface of the shallow trench, becomes even more important. To prevent the dishing effect occurring at the surface of a larger trench during CMP process and to obtain a superior CNDP uniformity, a reverse tone active mask was proposed, cooperating with an etching back process.

Typically, the active regions have varied sizes and the shallow trenches between the active regions also have different sizes. FIG. 1A to FIG. 1E are cross-sectional views showing the process steps for forming shallow trench isolation, using CMP. Referring to FIG. 1A, on a substrate 10, a pad oxide 15 and a silicon nitride layer 16 are deposited successively. By photolithography, the substrate 10, the pad oxide layer 15 and the silicon nitride layer 16 are anisotropically etched to form shallow trenches 14*a*, 14*b*, 14*c* and define active regions 12*a*, 12*b*, 12*c*, 12*d*. The sizes of the shallow trenches 14*a*, 14*b*, 14*c* are different since the sizes of the active regions 12*a*, 12*b*, 12*c*, 12*d* are varied.

Next, referring to FIG. 1B, an oxide layer 18 is deposited at atmospheric pressure chemical vapor deposition (APCVD) on a substrate 10 to fill the interior of the shallow trenches 14*a*, 14*b*, 14*c*. However, due to the step coverage of the oxide layer 18, the deposited oxide layer 18 has an uneven surface and a rounded shape. Then, a photoresist layer is coated on the surface of the oxide layer 16 and patterned to form a reverse active mask 20 by photolithography. The reverse active mask 20 covers the shallow trenches 14*a*, 14*b*, 14*c* and is complementary to the active regions 12*a*, 12*b*, 12*c*, 12*d*. However, during the formation of the reverse active mask, misalignment causes the oxide layer 18 to cover more than the shallow trenches 14*a*, 14*b*, 14*c*.

Referring to FIG. 1C, the oxide layer 18 exposed outside the reverse active mask 20 is etched until the silicon nitride layer 16 is exposed so that only a part of the silicon oxide layer 18, the silicon oxide layer 18*a*, is formed. After removing the reverse active mask 20, as shown in FIG. 1D, it is observable that the silicon oxide layer 18*a* remaining does not fully cover the shallow trenches 14*a*, 14*b*, 14*c* at one side of the shallow trenches 14*a*, 14*b*, 14*c*, therefore, forming cavities 22, but at the other side over-cover the shallow trenches 14*a*, 14*b*, 14*c*, forming photo-overlap 24.

Referring to FIG. 1E, the portion of the oxide layer 18*a* higher than the shallow trenches 14*a*, 14*b*, 14*c* is polished by CMP until the surface of the silicon nitride layer 16 is exposed. Therefore, the silicon nitride layer 16 and the silicon oxide layer 18*a* are at the same level. The profile of the silicon oxide layer 18*a* formed by APCVD is rather rounded and the APCVD silicon oxide layer 18*a* is hard to be planarized. Moreover, it is obvious that the silicon oxide layer 18*a* does not fully fill the shallow trenches 18*a*, 18*b*, 18*c* but form the cavities 22. The undesired cavities 22 may cause a kink effect and consequently short circuit or leakage current which therefore influences the yield.

As a result, it is important to overcome the problems coming after the formation of the concaves due to the misalignment of the reverse active mask during the process of CMP, especially, while nowadays the linewidth is decreasing.

SUMMARY OF THE INVENTION

It is therefore an objective of the present invention to provide a method of chemical-mechanical polishing for forming a shallow trench isolation. A substrate having a number of active regions, including a number of relatively large active regions and a number of relatively small active regions, is provided. The method comprises the following steps. A silicon nitride layer on the substrate is first formed. A number of shallow trenches are formed between the active regions. An oxide layer is formed over the substrate, so that the shallow trenches are filled with the oxide layer. A partial reverse active mask is formed on the oxide layer. The partial reverse active mask has an opening at a central part of each relatively large active region. The opening exposes a portion of the oxide layer. The opening has at least a dummy pattern. The oxide layer on the central part of each large active region is removed to expose the silicon nitride layer. The partial reverse active mask is removed. The oxide layer is planarized to expose the silicon nitride layer.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a process for forming STI, combining the partial reverse active mask and CMP, using high density plasma chemical vapor deposition (HDCVD). This process prevents the formation of concaves in the shallow trenches due to the misalignment of the reverse active mask, which consequently causes short circuit or leakage current.

Figure 1A:
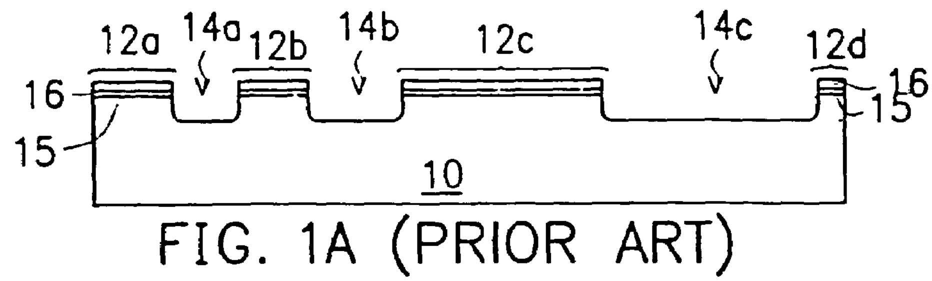
FIG. 1A to FIG. 1E are cross-sectional views showing the process steps of forming a conventional shallow trench using a reverse active mask.
Figure 1B:
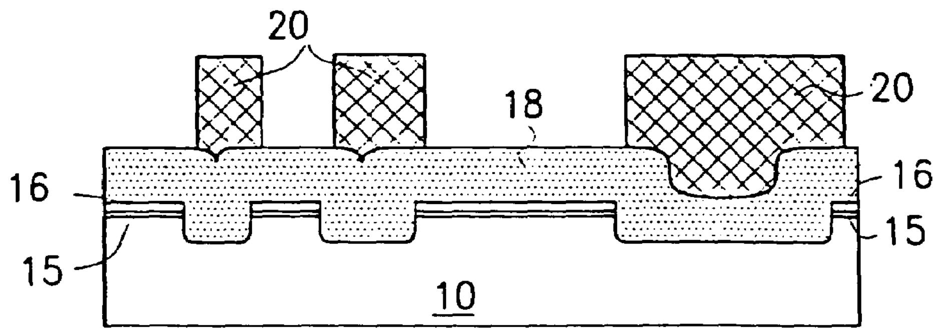
Figure 1C:
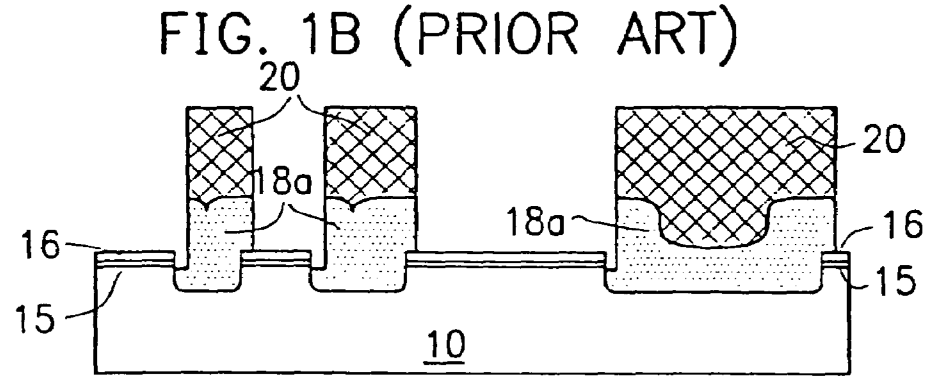
Figure 1D:
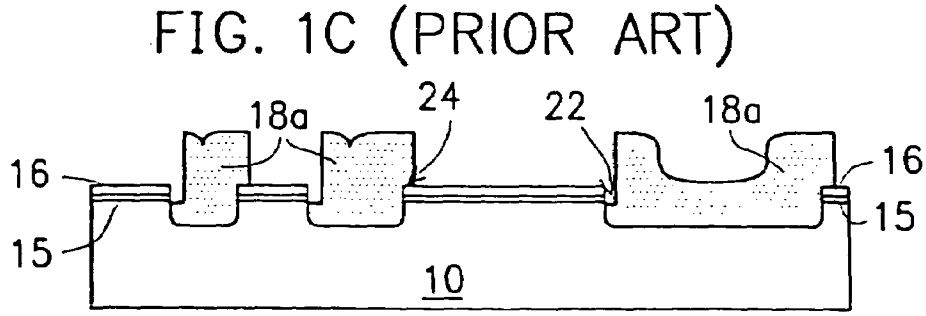
Figure 1E:
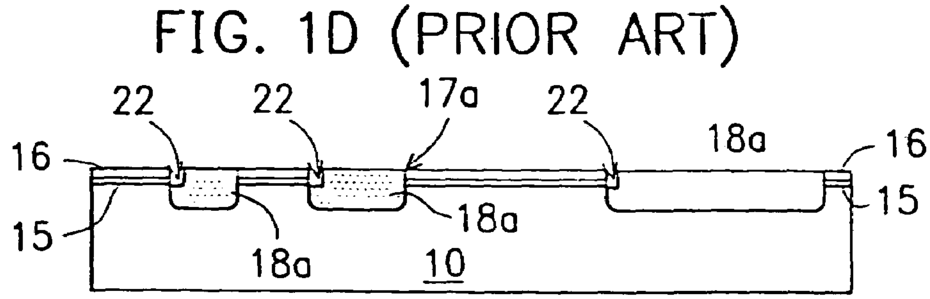
Figure 2A:
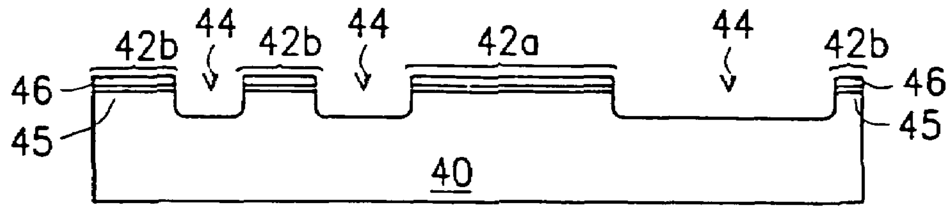
FIG. 2A to FIG. 2E are cross-sectional views showing the process steps of forming shallow trenches using a partial reverse active mask according to a preferred embodiment of the invention.
Figure 2B:
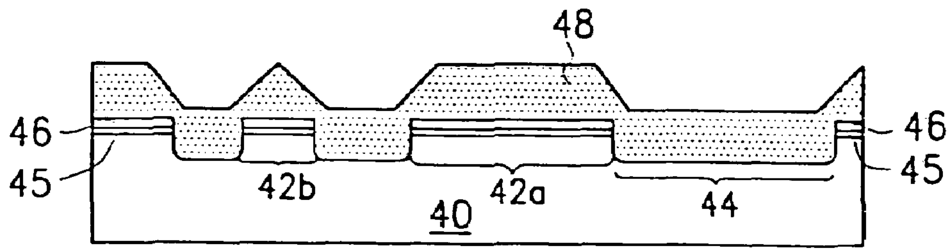

Referring to FIG. 2A, active regions 42a, 42b are defined on a substrate 40 first by depositing a pad oxide layer 45 and a silicon nitride layer 46, and then by photolithography and trench etching to form shallow trenches 44 between the active regions 42a, 42b. The sizes of the shallow trenches are varied since the sizes of the active regions 42a, 42b are different. Then, a silicon oxide layer 48 is deposited over the substrate 40 and filling the trenches 44, preferred by high density plasma chemical vapor deposition (HDPCVD). The profile of the silicon oxide layer 48 on the active region 42a, 42b is at a higher level than that of the silicon oxide layer 48 on the shallow trenches 44 since the shallow trenches are etched in the substrate 40. The HDPCVD oxide layer 48 on the active region 42a, 42b has a sharp profile, as shown in FIG. 2B, which is different from the conventional.

Figure 2C:
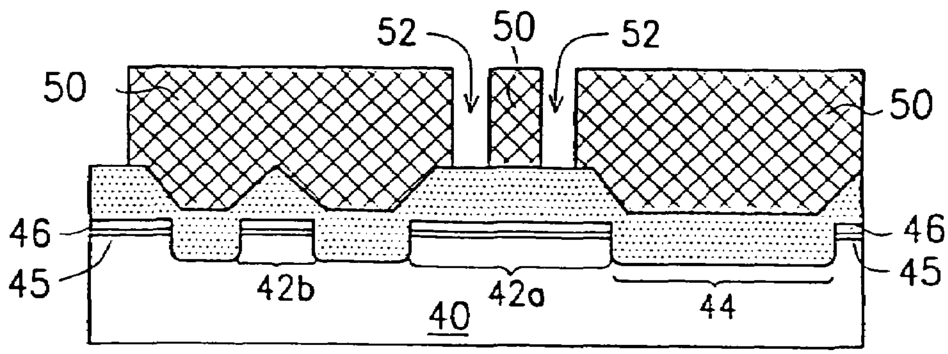

Referring to FIG. 2C, a photoresist layer is coated on the oxide layer 48 and defined to form a partial reverse active mask 50 by photolithography. The partial reverse active mask 50 has an opening 52 at the central part of the larger active region 42a. Since the opening 50 exposes only the central part of the silicon oxide layer 48 at the larger active region 42a, the silicon oxide layer 46 over the shallow trenches 44 will not be exposed even though misalignment occurs.

Figure 2D:
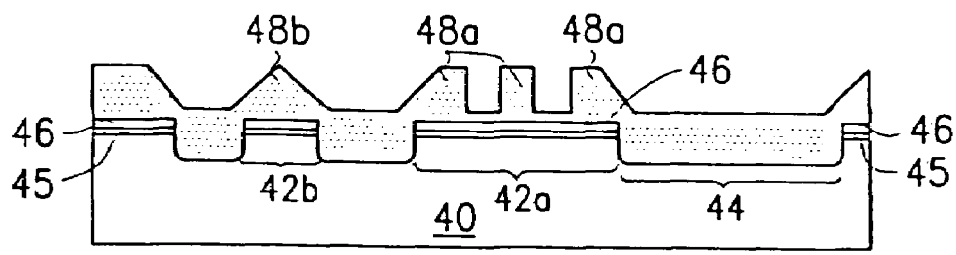

Referring to FIG. 2D, using the reverse active mask 50 as a mask, the exposed silicon oxide layer 48 at the larger active region 42a is etched back until the silicon nitride layer 46 is exposed. The reverse active mask is then peeled. Then, only the oxide layer 48b on the smaller active region 42b and a small portion of the silicon oxide layer 48a through etching back on the larger active region 42a remain. The remaining silicon oxide layer 48a and 48b formed preferably by HDPCVD have sharp profile and is therefore easy to be planarized by CMP. Also, the sizes of the remained silicon oxide layer 48a and 48b are more or less similar so that the consistency of CMP is increased.

Figure 2E:
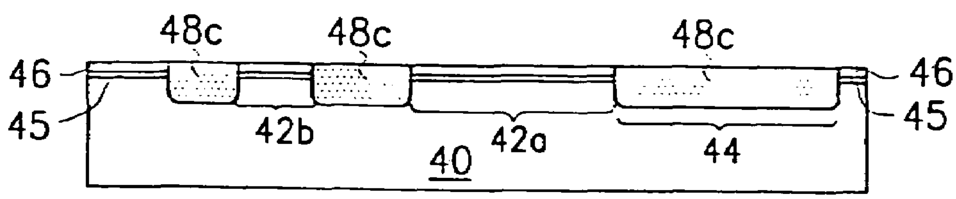

Next, referring to FIG. 2E, the remaining silicon oxide layer 48a and 48b (as shown in FIG. 2D) are polished by CMP, using the silicon nitride layer 46 as an etching stop layer so that the silicon oxide layer 48c in the shallow trenches and the silicon nitride layer 46 are almost at the same level.

Figure 3A:
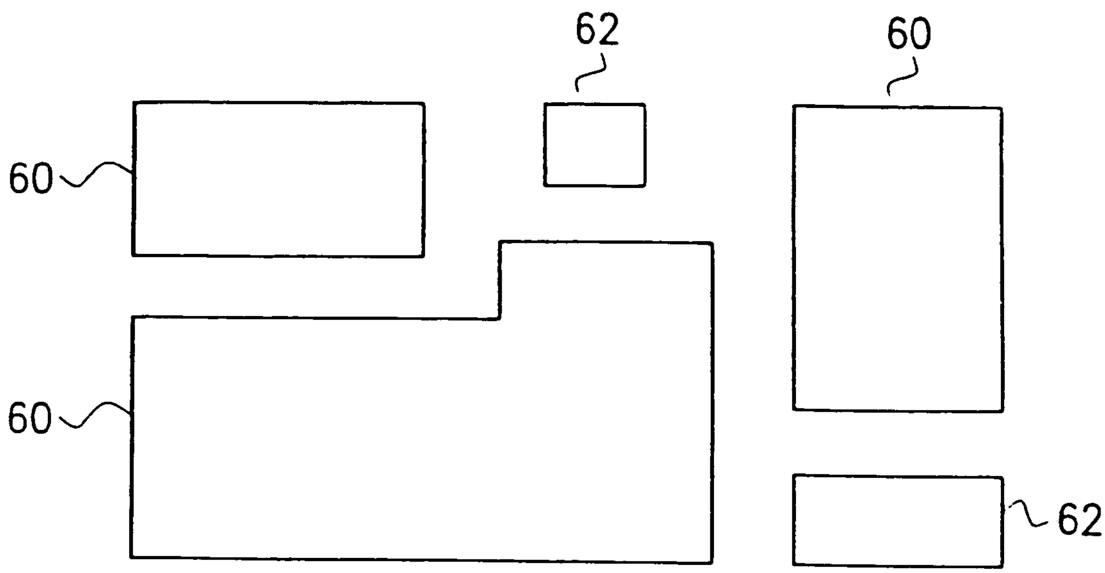
FIG. 3A to FIG. 3D illustrate the partial reverse active mask according to a preferred embodiment of the invention.

In the above embodiment, a partial reverse active mask is employed for forming a shallow trench isolation. In FIG. 3A to FIG. 3D, a method of forming a partial reverse active mask is shown. As shown in FIG. 3A, to define a photo-mask pattern, active regions are formed first. The active regions include a larger active region pattern 60 and a smaller active region pattern 62.

Figure 3B:
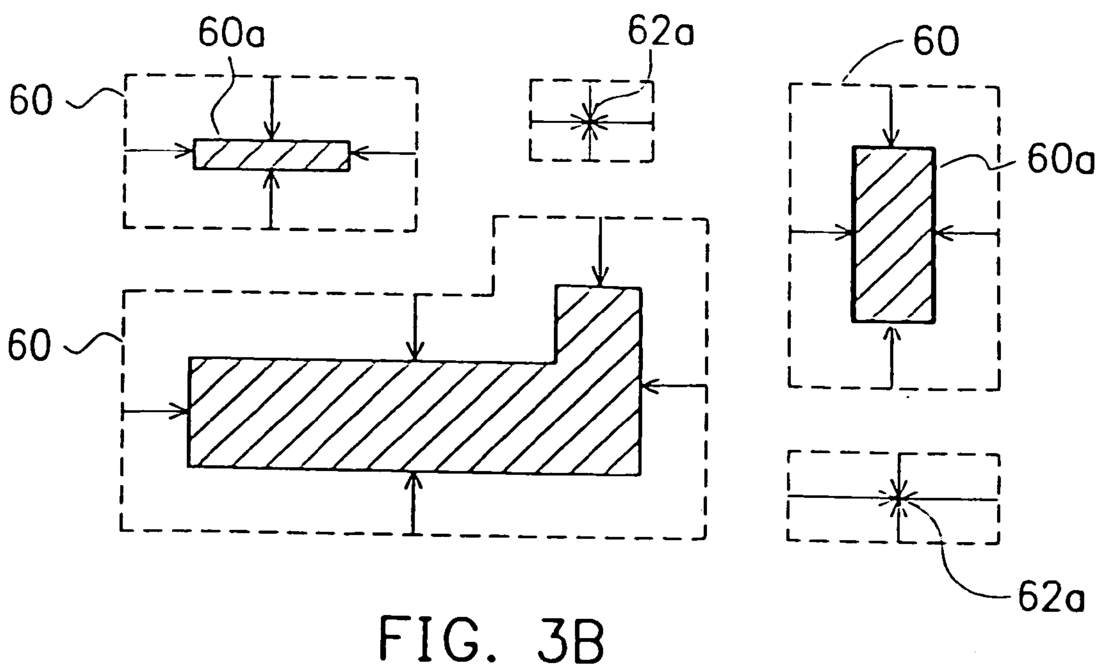

Referring to FIG. 3B, the larger active region pattern 60 and the smaller active pattern region 62 are shrunk as shown in the figure. The shrunken larger active region pattern and the shrunken smaller active region pattern are denoted as 60a and 62a respectively.

Figure 3C:
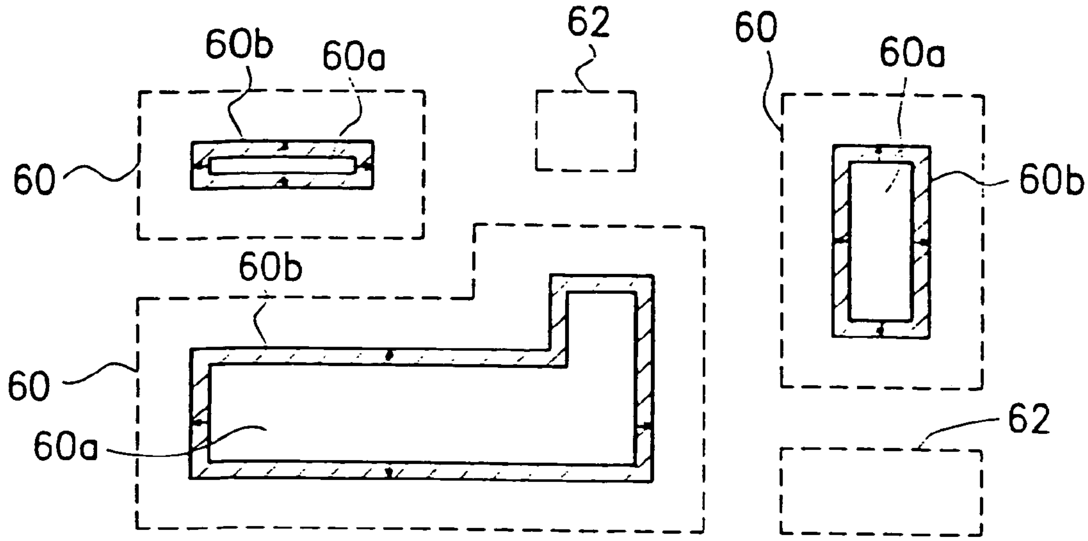

Referring to FIG. 3C, the shrinking process is continued until the shrunken smaller active region pattern 62a disappears. The shrinking distance is about 0.51 μm to 2 μm each side so that active region patterns with a maximum radius of less than 1~4 μm will disappear. Next, the shrunken larger active region 60a is enlarged until the profile of it is a little bit smaller than the profile of the original larger active region pattern. The profile of the larger active region pattern at this stage is denoted as 60b. The shrunken large active region pattern 62a is enlarged with a dimension of about 0.2 μm to 2 μm each side. This enlarged dimension is smaller than the shrinking distance mentioned above.

Figure 3D:
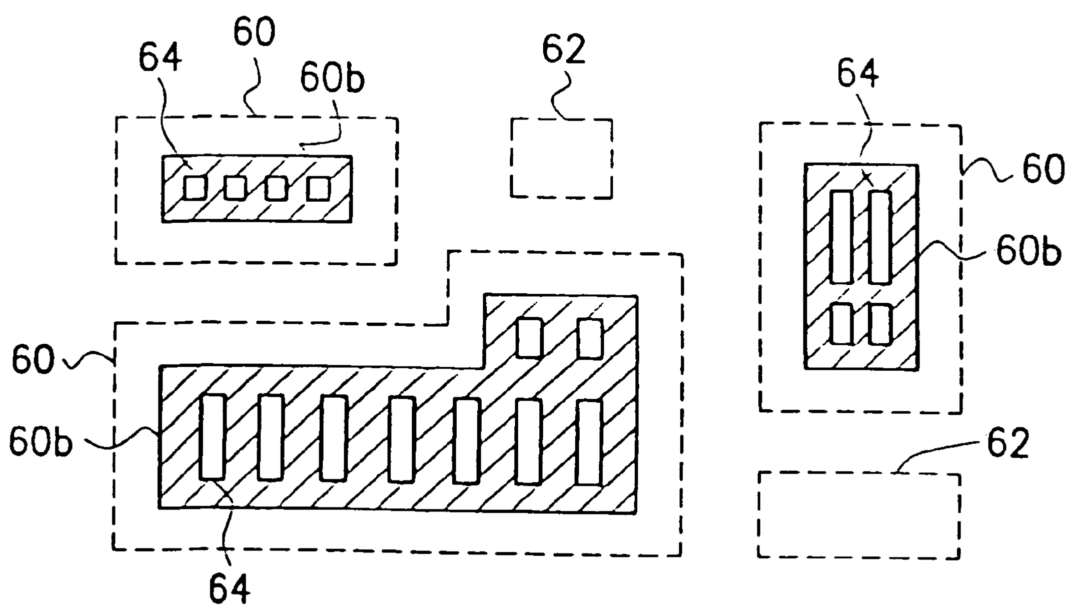

Referring to FIG. 3D, the partial reverse active mask 60b is located at the central part of the larger active region 60 but slightly smaller than the larger active region. One characteristic of the present invention is that the partial reverse active mask pattern 60b at the larger active region 60 has dummy pattern 64 so that dishing effect at the larger active region 60 can be avoided. By applying this photo-mask pattern in forming a shallow trench isolation, the central part of an active region is exposed, whereas the edge part of the active region is covered by a photoresist. A partial reverse active mask pattern is thus obtained.

The Advantages of the Invention are:

(1) The oxide layer formed by HDCVD has a pyramid-like profile, so that using chemical-mechanical polishing, the oxide layer is planarized easily.

(2) Using a partial reverse active mask to etch away the oxide layer on the central part of an active region, only the oxide layer on the edge part of the active region and on a small active region is remained. The profile of the remaining oxide layer is pyramid-like and has a better uniformity. Therefore, a recess formed while polishing a large trench is avoided.

(3) The dishing effect on the large active region is avoided since the partial reverse active mask has a dummy pattern.

(4) Since only the oxide layer on the central part of an active region is etched away by using a partial reverse active mask, even when a misalignment occurs, the oxide layer within the trench is not etched. The kink effect is prevented. As a consequence, the current leakage and the short circuit caused by kink effect are avoided, so that the yield of wafer is enhanced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of chemical-mechanical polishing for forming a shallow trench isolation, wherein a substrate having a plurality of active regions, including a plurality of relatively large active regions and a plurality of relatively small active regions, is provided, comprising:

forming a silicon nitride layer on the substrate;

forming a plurality of shallow trenches between the active regions;

forming an oxide layer over the substrate, so that the shallow trenches are filled therewith, forming a partial reverse active mask on the oxide layer, wherein the partial reverse active mask has an opening at a central part of each relatively large active region, wherein the opening exposes a portion of the oxide layer, and wherein the opening has at least a dummy pattern;

removing the oxide layer on the central part of each large active region to expose the silicon nitride layer therewithin;

removing the partial reverse active mask; and planarizing the oxide layer to expose the silicon nitride layer.

2. A method as claimed in claim 1, wherein the shallow trenches are formed by photolithography and etching.

3. A method as claimed in claim 1, wherein the oxide layer is formed by high density plasma chemical vapor deposition.

4. A method as claimed in claim 1, wherein the exposed portion of the oxide layer is removed by anisotropic etching.

5. A method as claimed in claim 4, wherein the exposed portion of the oxide layer is removed, using the silicon nitride layer as an etching stop layer.

6. A method as claimed in claim 1, wherein the oxide layer is planarized by chemical mechanical polishing.

7. A method of forming a partial reverse active mask pattern, applied in fabricating shallow trench isolation, wherein the method comprises:

providing a mask pattern, wherein the mask pattern comprises a plurality of relatively large active region patterns and a plurality of relatively small active region patterns;

shrinking the relatively large active region patterns and the relatively small active region patterns until the relatively small active region patterns disappear and the relatively large active region patterns become a remaining relatively large active region patterns; and enlarging the remaining relatively large active region patterns so that the remaining relatively large active region patterns are substantially smaller than original profiles of the relatively large active regions and each of the relatively large active region patterns has at least one dummy pattern.

8. A method as claimed in claim 7, wherein in said step of shrinking the relatively large active region patterns and the relatively small active patterns, a shrinking size is about between 0.5 μm and 2 μm.

9. A method as claimed in claim 7, wherein in said step of enlarging the remaining relatively large active region patterns, an enlarging size is about between 0.2 μm and 2 μm.

10. A method as claimed in claim 7, wherein an enlarging size in said step of enlarging the remaining relatively large active region patterns is substantially smaller than a shrinking size in said step of shrinking the relatively large active region patterns and the relatively small active patterns.

* * * * *